US009665006B2

(12) United States Patent
Graeschus et al.

(10) Patent No.: US 9,665,006 B2
(45) Date of Patent: May 30, 2017

(54) PROJECTION EXPOSURE METHOD AND PROJECTION EXPOSURE APPARATUS FOR MICROLITHOGRAPHY

(71) Applicant: Carl Zeiss SMT GmbH, Oberkochen (DE)

(72) Inventors: Volker Graeschus, Aalen (DE); Toralf Gruner, Aalen-Hofen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 335 days.

(21) Appl. No.: 14/456,819

(22) Filed: Aug. 11, 2014

(65) Prior Publication Data

US 2015/0029479 A1 Jan. 29, 2015

Related U.S. Application Data

(63) Continuation of application No. PCT/EP2013/052963, filed on Feb. 14, 2013.

(60) Provisional application No. 61/601,126, filed on Feb. 21, 2012.

(30) Foreign Application Priority Data

Feb. 20, 2012 (DE) .................. 10 2012 202 536

(51) Int. Cl.
  *G03B 27/54* (2006.01)
  *G03F 7/20* (2006.01)

(52) U.S. Cl.
  CPC ........ *G03F 7/70133* (2013.01); *G03F 7/7085* (2013.01); *G03F 7/70258* (2013.01)

(58) Field of Classification Search
  CPC ............ G03F 7/70258; G03F 7/70133; G03F 7/70785
  USPC .......................... 355/52, 53, 55, 67
  See application file for complete search history.

(56) References Cited

U.S. PATENT DOCUMENTS

| 6,927,901 B2 | 8/2005 | Mann et al. | |
| 8,553,200 B2* | 10/2013 | Wolschrijn | .......... G03F 7/70141 355/53 |
| 2003/0169520 A1 | 9/2003 | Goldstein | |
| 2005/0274897 A1 | 12/2005 | Singer et al. | |
| 2006/0146304 A1* | 7/2006 | Schwab | ................ G03B 27/42 355/53 |
| 2009/0153831 A1 | 6/2009 | Conradi et al. | |

(Continued)

FOREIGN PATENT DOCUMENTS

| DE | 10 2007 005 875 | 8/2008 |
| DE | 10 2011 004 326 | 8/2012 |

(Continued)

OTHER PUBLICATIONS

German Office Action, with translation thereof, for DE Appl No. 10 2012 202 536.7, dated Oct. 1, 2012.

(Continued)

*Primary Examiner* — Hung Henry Nguyen
(74) *Attorney, Agent, or Firm* — Fish & Richardson P.C.

(57) ABSTRACT

A projection exposure method for exposing a radiation-sensitive substrate with at least one image of a pattern of a mask is provided. The method includes determining at least one light quiver parameter which describes a property of a light quiver, and controlling the operation of the projection exposure apparatus taking account of the light quiver parameter.

26 Claims, 8 Drawing Sheets

(56) References Cited

U.S. PATENT DOCUMENTS

| | | | |
|---|---|---|---|
| 2010/0110406 A1* | 5/2010 | Usui | G03F 7/70091 355/67 |
| 2010/0231877 A1 | 9/2010 | Wolschrijn et al. | |
| 2011/0164232 A1* | 7/2011 | Freimann | G03F 7/70258 355/67 |
| 2012/0218536 A1 | 8/2012 | Bleidistel et al. | |

FOREIGN PATENT DOCUMENTS

| | | |
|---|---|---|
| EP | 1 251 402 B1 | 10/2002 |
| EP | 1 796 142 | 6/2007 |
| JP | 2005-328050 | 11/2005 |
| JP | 2010-502027 | 1/2010 |
| JP | 2010-541259 | 12/2010 |
| WO | WO 2004/031854 | 4/2004 |
| WO | WO 2009/100856 | 8/2009 |
| WO | WO 2011/038840 | 4/2011 |
| WO | WO 2011/051069 | 5/2011 |

OTHER PUBLICATIONS

International Search Report and Written Opinion for PCT/EP2013/052963, dated Jun. 20, 2013.
Japanese Office Action, with translation thereof, for corresponding JP Appl No. 2014-558069, dated Nov. 21, 2016.

* cited by examiner

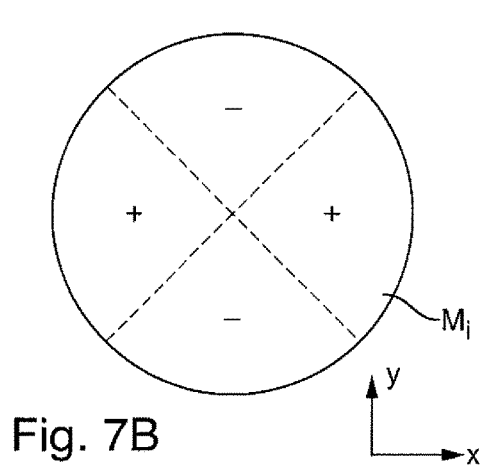
Fig. 7B
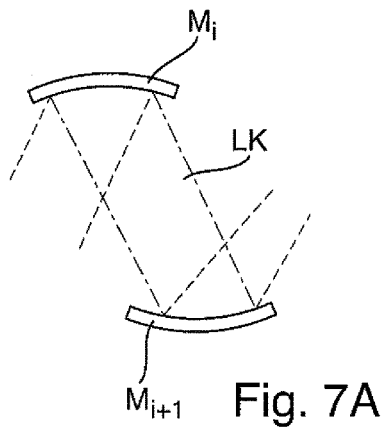
Fig. 7A
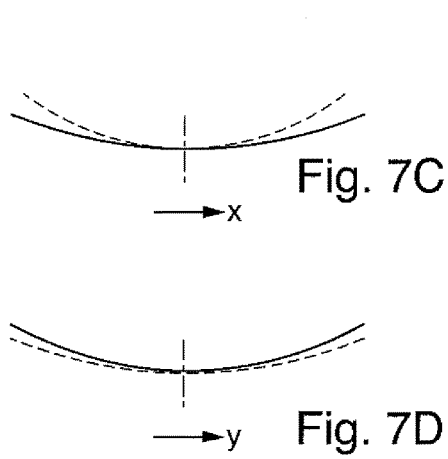
Fig. 7C
Fig. 7D
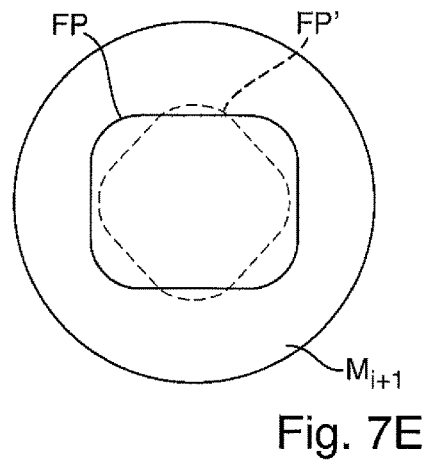
Fig. 7E
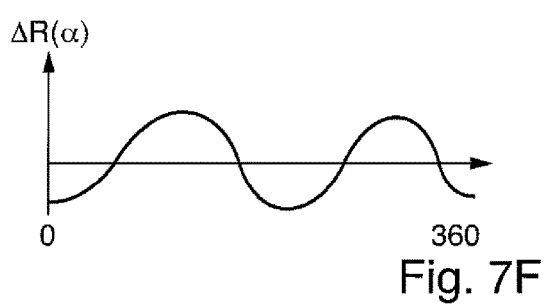
Fig. 7F
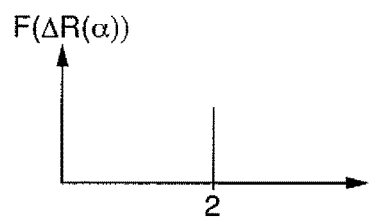
Fig. 7G

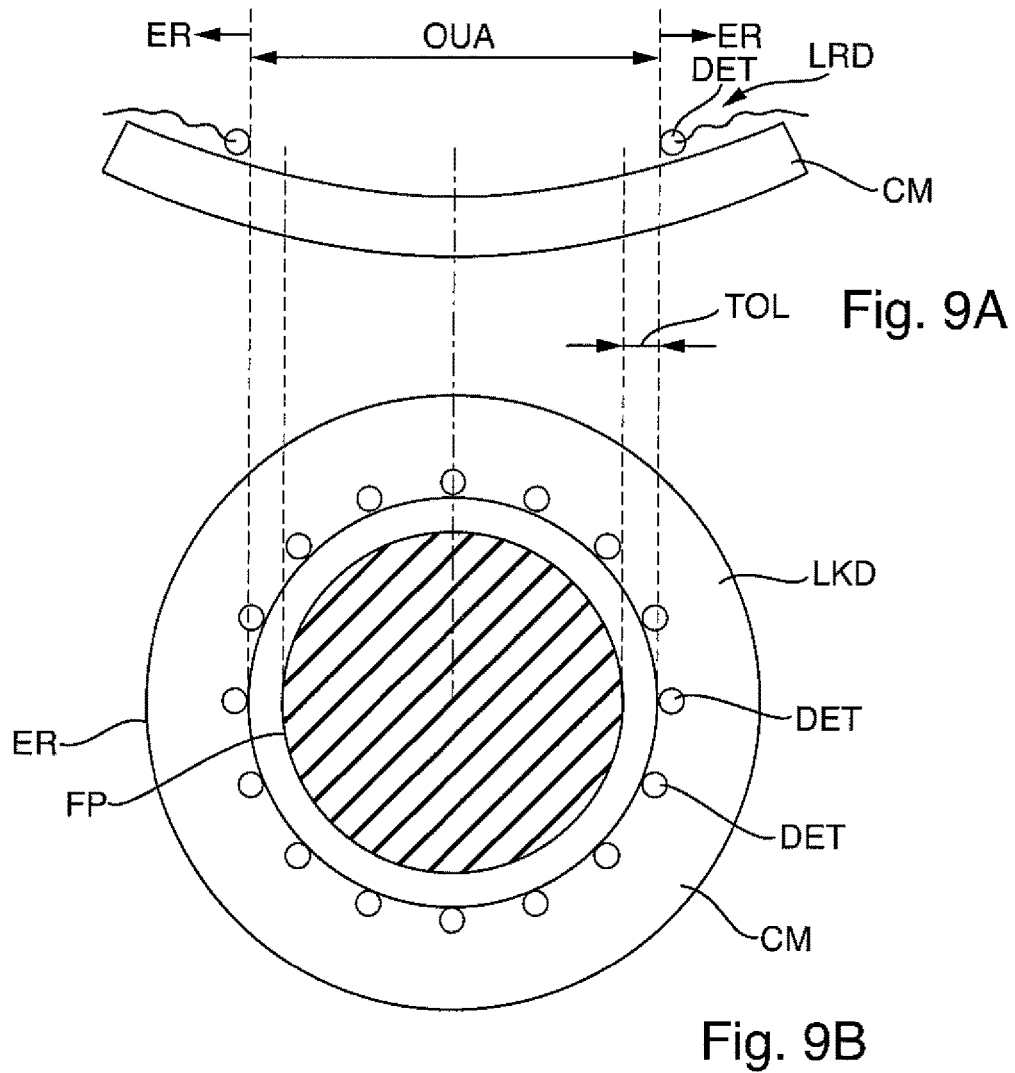
Fig. 9A
Fig. 9B
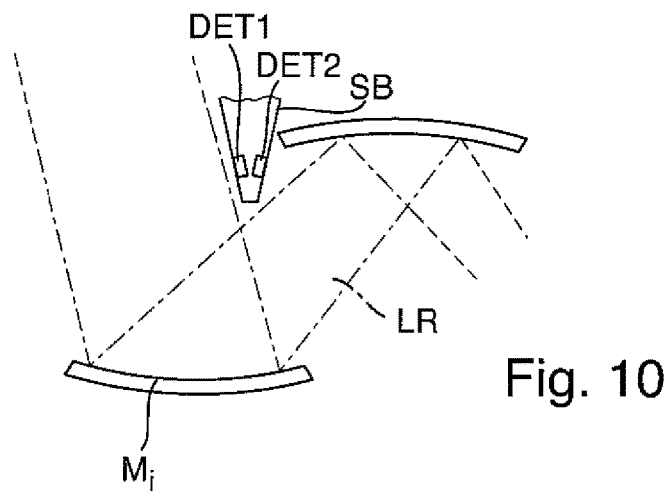
Fig. 10

PROJECTION EXPOSURE METHOD AND PROJECTION EXPOSURE APPARATUS FOR MICROLITHOGRAPHY

CROSS-REFERENCE TO RELATED APPLICATIONS

The present application is a continuation of, and claims benefit under 35 USC 120 to, international application PCT/EP2013/052963, filed Feb. 14, 2013, which claims benefit under 35 USC 119 of German Application No. 10 2012 202 536.7, filed Feb. 20, 2012. International application PCT/EP2013/052963 also claims priority under 35 USC 119(e) to U.S. Provisional Application No. 61/601,126, filed Feb. 21, 2012. The entire disclosures of international application PCT/EP2013/052963 and German Application No. 10 2012 202 536.7 are incorporated by reference herein.

BACKGROUND

Field of the Invention

The invention relates to a projection exposure method for exposing a radiation-sensitive substrate with at least one image of a pattern of a mask, and to a projection exposure apparatus suitable for carrying out the method.

Description of the Prior Art

Microlithographic projection exposure methods are predominantly used nowadays for producing semiconductor components and other finely patterned components. These methods involve the use of masks (photomasks, reticles) that bear or form the pattern of a structure to be imaged, e.g. a line pattern of a layer of a semiconductor component. The mask is positioned in a projection exposure apparatus in the beam path between an illumination system and a projection lens such that the pattern lies in the region of the object plane of the projection lens. A substrate to be exposed, for example a semiconductor wafer coated with a radiation-sensitive layer (resist, photoresist), is held in such a way that a radiation-sensitive surface of the substrate is arranged in the region of an image plane of the projection lens, the image plane being optically conjugate with respect to the object plane. During an exposure process, the pattern is illuminated with the aid of the illumination system, which, from the radiation of a primary radiation source, shapes an illumination radiation which is directed onto the pattern and which is characterized by specific illumination parameters and impinges on the pattern within an illumination field of defined form and size. The radiation altered by the pattern passes as projection radiation through the projection lens, which images the pattern onto the substrate which is to be exposed and is coated with a radiation-sensitive layer. Microlithographic projection exposure methods can e.g. also be used for producing masks (recticles).

One of the aims in the development of projection exposure apparatuses is to produce structures having increasingly smaller dimensions on the substrate via lithography. Smaller structures lead to higher integration densities e.g. in the case of semiconductor components, which generally has a favorable effect on the performance of the microstructured components produced. The size of the structures that can be produced is crucially dependent on the resolving power of the projection lens used and can be increased firstly by reducing the wavelength of the projection radiation used for projection, and secondly by increasing the image-side numeral aperture NA of the projection lens that is used in the process.

In the past, refractive projection lenses have predominantly been used for optical lithography. In the case of a refractive or dioptric projection lens, all of the optical elements which have a refractive power are transparent refractive elements (lens elements).

In order to ensure a sufficient correction of aberrations, in particular chromatic aberrations, and of the image field curvature, even at shorter wavelengths, catadioptric projection lenses are increasingly being used, that is to say projection lenses containing both transparent refractive optical elements having a refractive power, that is to say lens elements, and reflective elements having a refractive power, that is to say curved mirrors. Typically, at least one concave mirror is contained.

Furthermore, optical systems for microlithography have been developed which operate with moderate numeral apertures and obtain the increase in the resolving power essentially by virtue of the short wavelength of the used electromagnetic radiation from the extreme ultraviolet range (EUV), in particular having operating wavelengths in the range of between 5 nm and 30 nm. Radiation from the extreme ultraviolet range (EUV radiation) cannot be focused or guided with the aid of refractive optical elements, since the short wavelengths are absorbed by the known optical materials that are transparent at higher wavelengths. Mirror systems are therefore used for EUV lithography. The masks used are reflective masks.

Projection lenses generally have a multiplicity of optical elements in order to make possible in part contrary requirements with regard to the correction of imaging aberrations if appropriate also in the case of large numeral apertures used. Both refractive and catadioptric imaging systems in the field of microlithography often have ten or more transparent optical elements. In systems for EUV lithography, it is endeavored to manage with the fewest possible reflective elements, e.g. with four or six mirrors.

The optical elements are held with the aid of holding devices at defined positions along a projection beam path of the projection lens. Lens elements and other optical elements are often held via a multiplicity of holding elements arranged at the circumference of the respective optical element. In this case, the optical element has an optical used region lying in the projection beam path and an edge region lying outside the optical used region, wherein one or a plurality of holding elements of the holding device assigned to the optical element engage on the edge region. Refractive or specularly reflective surfaces with optical quality are prepared in the optical used region, while the optical quality does not have to be achieved in the edge region. The optical used region is often also designated as "free optical diameter" of the optical element.

Besides the intrinsic imaging aberrations which a projection lens can have on account of its optical design and production, imaging aberrations can also occur during the period of the use, e.g. during the operation of a projection exposure apparatus by the user. Such imaging aberrations are often caused by alterations of the optical elements incorporated in the projection lens as a result of the projection radiation used in the course of the use. By way of example, a certain part of the projection radiation can be absorbed by the optical elements in the projection lens. The extent of the absorption is dependent, inter alia, on the material used for the optical elements, for example the lens element material, the mirror material and/or the properties of antireflection coatings or reflection coatings possibly provided. The absorption of the projection radiation can lead to heating of the optical elements, as a result of which, in the optical elements, a surface deformation and, in the case of refractive elements, a change in refractive index can be brought about directly and indirectly via thermally induced mechanical stresses. Changes in refractive index and surface deformations lead, in turn, to alterations of the imaging properties of the individual optical elements and hence also of the projection lens overall. This problem area is often dealt with under the key words "lens heating".

Other internal or external disturbances can also lead to the impediment of the imaging performance. They include, inter alia, a possible scale error of the mask, alterations of the air pressure in the surroundings, differences in the strength of the gravitational field between the location of the original lens adjustment and the location of use by the customer, changes in refractive index and/or form alterations of optical elements on account of material alterations as a result of high-energy radiation (e.g. compaction), deformations on account of relaxation processes in the holding devices, drifting of optical elements and the like.

Attempts are usually made to at least partly compensate for imaging aberrations that occur during the service life, in particular the imaging aberrations that occur during operation, by using manipulators. The term "manipulator" in this case denotes, inter alia, optomechanical devices that are designed to act, on account of corresponding control signals of an operating control system, actively on individual optical elements or groups of optical elements in order to alter the optical effect thereof, in particular to alter it in such a way that an aberration that occurs is at least partly compensated for. The term "manipulator" also encompasses devices which, on account of corresponding control signals of an operating control system, act on the mask or on the substrate in order, for example, to displace, to tilt and/or to deform the mask or the substrate. A manipulator can be designed e.g. for decentering an optical element along or perpendicular to a reference axis, tilting an optical element, locally or globally heating or cooling an optical element, and/or for deforming an optical element.

A manipulator contains one or a plurality of actuating elements or actuators, the present actuating value of which can be changed or adjusted on account of control signals of the operating control system. If an actuating value change involves a movement of an actuator, e.g. in order to displace or to tilt an optical element, then an actuating value change can also be designated as "manipulator travel". An actuating value change can also be present e.g. as a temperature change or as a change in an electrical voltage.

High-productivity projection exposure apparatuses for microlithography comprise an operating control system which makes it possible to perform a near-instantaneous fine optimization of imaging-relevant properties of the projection exposure apparatus in reaction to environmental influences and other disturbances. For this purpose, appropriately to the present system state, at least one manipulator is driven in order to counteract a disadvantageous effect of a disturbance on the imaging performance. In this case, the system state can be estimated e.g. on account of measurements, from a simulation and/or on the basis of calibration results, or can be determined in some other way. In this case, in general information concerning the present use is also taken into consideration, which includes in particular, information about the diffracting and/or the phase altering structure of the pattern to be imaged and/or information concerning the illumination mode used (illumination setting).

The actuating value changes on manipulators, or on actuators of manipulators, required for a desired intervention in the system are determined in known operating control systems on the basis of a control program with a correction algorithm that optimizes a target function (merit function). What is thus intended to be achieved, inter alia, is that, rather than an individual residual aberration being minimized at the cost of others, an expedient, balanced reduction of all relevant influencing variables to values that can be afforded tolerance is achieved.

The European Patent EP 1 251 402 B1 describes an operating control system that uses a target function. In this case, the target function describes the quality of the exposure process as a weighted sum of a multiplicity of "lithographic aberrations". In this case, the term "lithographic aberration" is intended to encompass all defects relevant to lithography during the imaging. The lithographic aberrations include, inter alia, aberrations such as distortion, deviations of the lateral image position, image rotation, asymmetrical magnification, deformations of the focus position, etc., but also variations of the critical dimensions over the image field (CD variations), differences in the critical dimensions in mutually orthogonal directions (HV aberrations), etc. These lithographic aberrations are influenced by various properties of the projection exposure apparatus or of the projection exposure process, including the substrate, the radiation-sensitive layer on the substrate, the projection ray provided by the light source, the mask and the projection system.

PROBLEM AND SOLUTION

One problem addressed by the invention is that of providing a projection exposure method of the type mentioned in the introduction wherein an improved near-instantaneous fine optimization of the imaging properties is possible. A further problem addressed is that of providing a projection exposure apparatus which allows a good imaging quality during the lithographic projection exposure under a wide variety of operating conditions.

In order to solve these and other problems, the invention provides a projection exposure method for exposing a radiation-sensitive substrate with at least one image of a pattern of a mask, comprising the following steps: holding the mask between an illumination system and a projection lens of a projection exposure apparatus in such a way that the pattern is arranged in the region of the object plane of the projection lens; holding the substrate in such a way that a radiation-sensitive surface of the substrate is arranged in the region of an image plane of the projection lens, the image plane being optically conjugate with respect to the object plane; illuminating an illumination region of the mask with an illumination radiation provided by the illumination system; and projecting a part of the pattern lying in the illumination region onto an image field at the substrate with the aid of the projection lens, wherein all rays of the projection radiation which contribute to image generation in the image field form a light quiver in the projection lens, wherein: determining at least one light quiver parameter which describes a property of the light quiver; and controlling the operation of the projection exposure apparatus taking account of the light quiver parameter. Also provided is a projection exposure apparatus suitable for carrying out the projection exposure method: an illumination system for receiving primary radiation of a primary radiation source and for generating an illumination radiation directed onto the mask in an illumination region; a projection lens for projecting a part of the pattern lying in the illumination region onto an image field at the substrate with projection radiation, wherein all rays of the projection radiation which contribute to image generation in the image field form a light quiver in the projection lens; a mask holding device for holding the mask between the illumination system and the projection lens in such a way that the pattern is arranged in the region of an object plane of the projection lens; a substrate holding device for holding the substrate in such a way that a radiation-sensitive surface of the substrate is arranged in the region of the image plane of the projection lens, the image plane being optically conjugate with respect to the object plane; wherein: a light quiver detection system for determining at least one light quiver parameter which describes a property of the light quiver; and an operating control system configured for controlling the operation of the projection exposure apparatus taking account of the light quiver parameter.

Advantageous developments are specified in the disclosure. The wording of all of the claims is incorporated by reference in the content of the description.

One aspect of the invention proposes including a possible variation of the light quiver, which variation occurs e.g. with respect to one or a plurality of optical elements of the optical system and/or with respect to the mask and/or the substrate, as optimization parameter in a target function (merit function) for controlling a projection exposure apparatus, preferably in addition to one or a plurality of other optimization parameters.

In this case, the term "light quiver" denotes a volume in three-dimensional space ("subset of $R^3$"), which is defined by the fact that at least one continuous ray runs through each of its points from the object field within the object-side used aperture to the image field within the image-side used aperture. The form and position of the light quiver during a process are generally dependent on the present field size and the diffraction orders. If a maximum field size with incoherent illumination is considered, then mention can be made of the "maximum light quiver".

Analogously to a conventional quiver, which can be described as container for arrows, the light tube can be regarded as a "container" for the rays passing from the object field to the image field. The light quiver could be equivalently designated e.g. by the term "ray quiver".

Those rays which do not belong to the light quiver include preliminarily the so-called "superaperture rays". They are understood here to mean those rays which are diffracted by the structure-imparting mask and emitted at an angle which is greater than the object-side aperture angle used for the imaging, which is determined by the present diameter of the aperture stop delimiting the projection beam path. The object-side aperture angle defines the object-side used aperture. The same correspondingly holds true on the image side, i.e. on the side of the image that is optically conjugate with respect to the object.

In many practical situations, the sensitivity of the light quiver to manipulator movements or other system changes can be determined sufficiently accurately via the tracing of the chief ray and in each case 2 sagittal and meridional rays, e.g. for field corners and field center. The light quiver is therefore a variable accessible by calculation. The light quiver is simultaneously a variable accessible via measurements.

In conventional systems, an alteration of the light quiver, for example a lateral displacement of the light quiver relative to the optical elements, is not taken into account in the adjustment (actuating value change) of one or a plurality of manipulators. However, this effect can, for example, have the consequence that used light travels from the projection beam path into a critical region outside the optical used region of at least one optical element and the imaging performance thereby decreases overall. By way of example, used light can be directed into a region in which no optical element is active at all. It is also possible for used light to pass into a region in which the quality of the optical fit is significantly poorer (i.e. the fit error is significantly greater) than in the optical used region and/or in which optically active layer systems (mirror layers, antireflection coatings) do not or no longer have an optimal effect.

If an alteration of the light quiver leads, for example, to a lateral displacement of the position of the light quiver in the region of a pupil plane, in which an aperture stop is situated, then an asymmetrical cutting-out of the diffraction light active for the imaging can occur, which can in turn lead to telecentricity aberrations and/or to imaging differences between horizontal and vertical structures (HV differences) and/or to similar lithography aberrations.

A variation of the light quiver can therefore cause a wide variety of lithographic aberrations, inter alia vignetting and/or telecentricity aberrations. Inter alia, such lithographic aberrations can be limited to non-critical values or completely avoided.

The light quiver, in particular the location or position of the light quiver with respect to a reference coordinate system, the dimensions of the light quiver in cross section and/or the cross-sectional form of the light quiver, can change on account of different causes. Particularly great changes can arise when a property of the light quiver is altered by the driving of a manipulator or of a plurality of manipulators. In projection exposure apparatuses comprising manipulators, one possibility for taking account of variations or alterations of the light quiver during the control of a projection exposure apparatus consists in—in a correction algorithm of the operating control system—also storing sensitivities of manipulators for the alteration of the light quiver or determining such sensitivities and storing them in a memory of the operating control system and controlling the operation of the projection exposure apparatus taking account of the sensitivities. In this case, the term "sensitivity" describes the relationship between a defined actuating value change at a manipulator and the resultant effect on the imaging quality or on lithographic aberrations.

If it emerges in this case, for example, that even a small actuating value change of a manipulator leads to a great displacement of the light quiver into a critical region, then actuating value changes of the manipulator can be limited to relatively small magnitudes taking account of the variation of the light quiver, in order that the lithographic aberrations caused by a displacement of the light quiver or some other alteration of the light quiver are kept sufficiently small. This can be achieved by virtue of the fact that permissible actuating value changes of a manipulator are limited by control engineering taking account of the sensitivities to magnitudes below an actuating value limit value. This measure takes account of the fact that a permitted actuating value range, the so-called "range" of a manipulator, can change when taking account of light quiver variations in comparison with a projection exposure apparatus not taking account of the light quiver variation.

The adjustment or movement of a single manipulator can cause great alterations of position and/or form of the light quiver. Therefore, two or more manipulators turn often moved in a coordinated manner such that their effects on the generated image at least partly compensate for one another. In this case, too, taking account of changes to position and/or form of the light quiver can bring improved results.

There are various possibilities for determining at least one light quiver parameter which describes a property of a light quiver. It has proved to be expedient if at least one measurement surface running transversely with respect to the light quiver is selected such that the light quiver intersects the measurement surface in the region of an intersection surface defined in terms of form, position and size, wherein at least one intersection surface property dependent on the intensity of the projection radiation in the intersection surface is determined for the purpose of determining a light quiver parameter. The intersection surface can be defined e.g. as the totality of all points of the measurement surface at which the intensity of the projection radiation exceeds a predefined intensity threshold value.

The measurement surface can be a planar measurement surface or an at least regionally curved measurement surface, which can be spherically or aspherically curved. Measurement surface forms having high symmetry, for example planar or spherically curved measurement surfaces, can be advantageous with regard to simple evaluation of the intersection surface properties.

In order to be able to reliably detect a displacement of the light quiver, provision can be made for determining the location or position of the intersection surface with respect to a reference coordinate system and deriving a light quiver position parameter therefrom, the parameter including information about the position of the intersection surface. Great alterations of the position of the light quiver can occur, for example, when elements in the optical beam path are tilted.

Alternatively or additionally, the form or shape of the intersection surface can be determined and a light quiver form parameter can be derived therefrom, the parameter representing the form of the intersection surface. Thus, by way of example, an elliptical or other type of deformation of a nominally round cross-sectional region of the light quiver can be detected particularly accurately qualitatively, semi-quantitatively or quantitatively. Deformations of the intersection surface form can arise, for example, if the optical surface of an optical element situated upstream of the measurement surface is deformed.

Alternatively or additionally, provision can be made for determining the size or extent of the intersection surface with respect to a reference coordinate system, and deriving a light quiver size parameter therefrom. The size of an intersection surface can change, for example, when an optical element situated upstream of the measurement surface in the light propagation direction is deformed or the distance between mask and projection lens is altered.

In some embodiments, alternatively or additionally, provision is made for determining an energetic or geometric centroid of the intensity distribution within the intersection surface and deriving a light quiver centroid parameter therefrom. It is thus possible to detect all light quiver alterations which lead to an alteration of the position of the centroid of the intensity distribution, for example a global lateral displacement of the light quiver or an asymmetrical form change.

If it is desired to determine intensity shifts within the intersection surface, a local intensity distribution or an intensity profile within the intersection surface could also be determined.

Preferably, at least two intersection surface properties are determined in temporal proximity or at the same time and the corresponding light quiver parameters thereof are taken into account computationally with one another or used for characterizing an intersection surface property. This makes it possible to obtain in many cases more reliable and/or better detailed information about the lighter quiver variation than in the case where only one light quiver parameter is determined. Moreover, if appropriate, it is possible to obtain additional information which cannot be obtained from each of the individual intersection surface properties by themselves. By way of example, a form change of the intersection surface can occur without the geometric centroid being displaced. Such form changes can then be distinguished from form changes with centroid displacement. As a result, e.g. statements about the symmetry of a form change are possible.

In one method variant, light quiver properties are determined by carrying out a determination of the position of the centroid and, on the basis thereof, determining an edge curve function describing the distance radius of the edge curve of the intersection surface, i.e. the radial distance between the edge curve and the centroid, as a function of the azimuth angle, and the edge curve function is then analyzed. A Fourier analysis of the edge curve function is preferably carried out during the analysis. It is thereby possible to determine certain characteristics of the edge curve or of the form of the intersection surface, e.g. specific symmetry properties, for example with regard to the undulation.

The measurement surface can be a virtual, mathematically definable surface which is at a distance from adjacent optical surfaces of optical elements. By way of example, the measurement surface could be a planar or curved surface which is defined by an aperture stop of the projection lens or by the position and form of some other planar or curved diaphragm.

Alternatively or additionally, provision can be made for selecting an optical surface of an optical element as a measurement surface. By way of example, the measurement surface can be a convexly or concavely curved lens element surface or a convexly or concavely curved mirror surface, but also, if appropriate, a plane surface of a lens element or of a prism or a plane surface of a deflection mirror.

If an optical surface of an optical element is selected as a measurement surface, then in some embodiments it is provided that a light quiver parameter is determined by measuring at least one property of the optical surface which is variable as a result of projection radiation being incident on the optical element. By way of example, a local temperature distribution can be measured at the optical surface selected as measurement surface and at least one intersection surface property is determined therefrom.

If the measurement surface is a mirror surface, it is possible to measure e.g. a local intensity distribution of residual light transmitted by the mirror surface from the rear side of the mirror, in order to determine at least one intersection surface property therefrom (spatially resolved transmission measurement).

An intensity measurement in the region of the measurement surface is possible in many cases. By way of example, the light quiver detection device can have an arrangement—surrounding the light quiver—comprising a plurality of light-sensitive sensors or detectors distributed uniformly or non-uniformly around the circumference of the light quiver. This can involve diodes or camera sensors, for example, if appropriate with upstream optical systems for ray guiding or ray deflection. Such sensors can be arranged, for example, directly at an optical element forming the measurement surface or in direct proximity thereto just outside the optical used region, or else on spurious light diaphragms or at an aperture stop.

The invention also provides a projection exposure apparatus suitable for carrying out the projection exposure method. The projection exposure apparatus is characterized by a light quiver detection device for determining at least one light quiver parameter which describes a property of the light quiver, and an operating control system configured for controlling the operation of the projection exposure apparatus taking account of the light quiver parameter.

The light quiver detection device can have one or a plurality of devices or means for carrying out the method steps.

In practice, in complexly constructed optical systems, the radiation not only passes through the projection beam path desired for imaging from the object into the image plane, rather radiation portions which do not contribute to the imaging can also arise. By way of example, so-called "superaperture light" can arise in projection exposure methods. The term "superaperture light" or "superaperture radiation" denotes here radiation which is diffracted by the structure-imparting mask and is emitted at an angle which is greater than the object-side aperture angle which is used for the imaging and which is determined by the current diameter of the aperture stop delimiting the projection beam path.

Alternatively or additionally, it is also possible for stray light to be generated, which generally impairs the contrast of the generated image if it passes right into the image plane. The term "stray light" here denotes, inter alia, such radiation which can arise, for example, as a result of residual reflection at the surfaces of transparent optical elements that are covered with antireflection layers, at the rear sides of mirrors and/or at other locations in the region of the projection beam path. These undesirable radiation portions, in particular the stray light and the superaperture light, are also designated as "extraneous light", independently of their cause, in the context of this application.

In some embodiments, light-sensitive sensors of a light quiver detection device are arranged in such a way that they can detect extraneous light which propagates outside the light quiver in direct proximity to them. Information about the properties of the light quiver can be derived from the corresponding intensity signals.

The above features and further features emerge not only from the claims but also from the description and from the drawings, wherein the individual features can in each case be realized by themselves or a plurality in the form of subcombinations in an embodiment of the invention and in other fields and can constitute advantageous and inherently protectable embodiments. Exemplary embodiments of the invention are illustrated in the drawings and explained in greater detail below.

BRIEF DESCRIPTION OF THE DRAWINGS

FIGS. 7A to 7G show different aspects of a complex form change—caused by astigmatic deformation of one mirror—of a footprint of a light quiver on another mirror and possibilities for the quantitative description of the associated light quiver variation;

FIGS. 9A and 9B show a sectional view and a plan view, respectively, of one embodiment of a light quiver detection device; and FIG. 10 shows a sectional view of another embodiment of a light quiver detection device.

DETAILED DESCRIPTION OF THE PREFERRED EMBODIMENTS

Figures 1A, 1B:
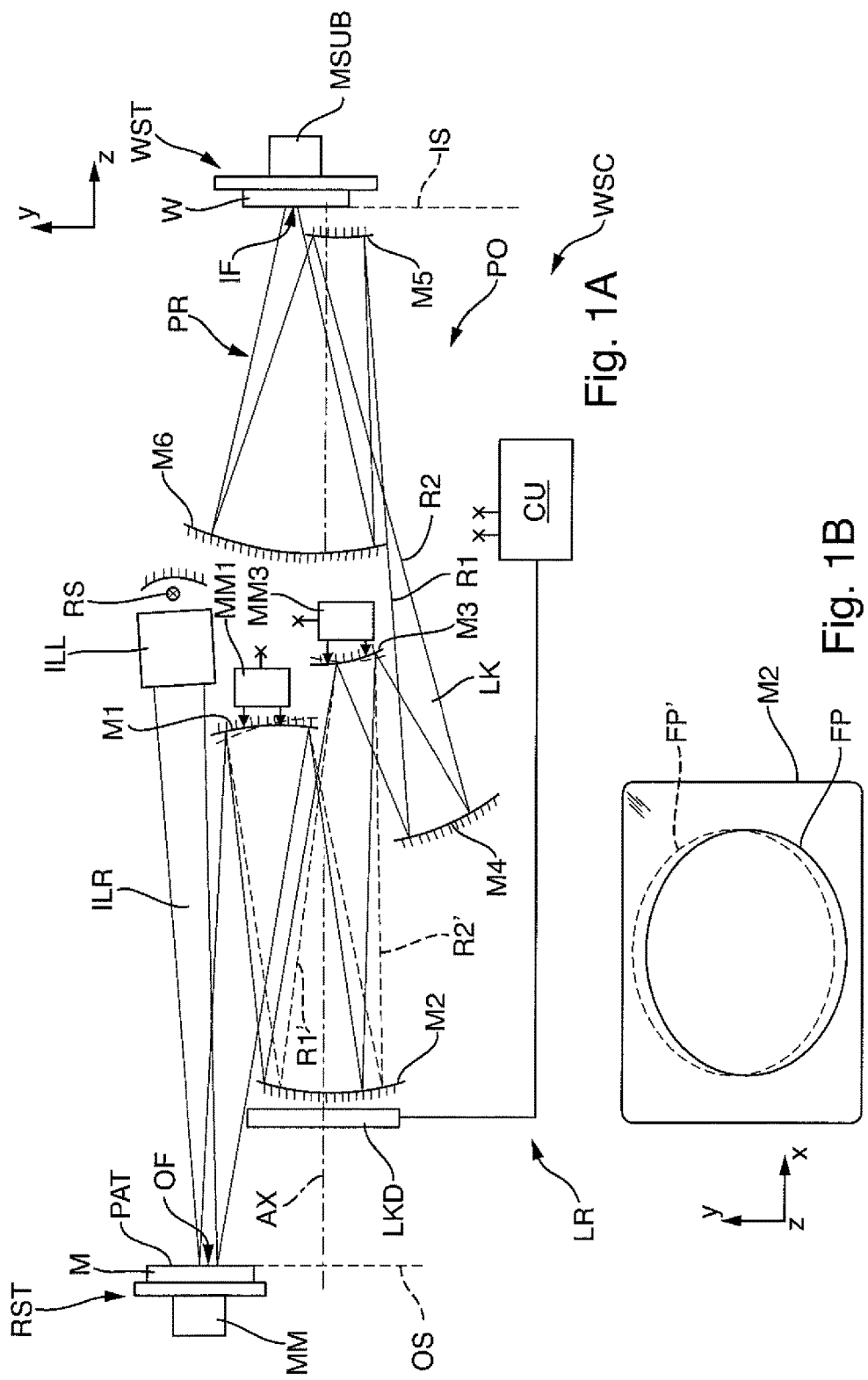
FIGS. 1A and 1B schematically show components of an EUV microlithography projection exposure apparatus in accordance with one embodiment of the invention in two different operating states.

FIG. 1A schematically shows components of an EUV microlithography projection exposure apparatus WSC for exposing a radiation-sensitive substrate W arranged in the region of an image plane IS of a projection lens PO with at least one image of a pattern PAT of a reflective mask M, the pattern being arranged in the region of an object plane OS of the projection lens.

The projection exposure apparatus is operated with the radiation of a primary radiation source RS. An illumination system ILL serves for receiving the radiation of the primary radiation source and for shaping illumination radiation ILR directed onto the pattern. The projection lens PO serves for imaging the structure of the pattern onto the light-sensitive substrate W.

The primary radiation source RS can be, inter alia, a laser plasma source or a gas discharge source or a synchrotron-based radiation source. Such radiation sources generate a radiation in the extreme ultraviolet range (EUV range), in particular having wavelengths of between 5 nm and 15 nm. In order that the illumination system and the projection lens can operate in the wavelength range, they are constructed with components that are reflective to EUV radiation.

The radiation emerging from the radiation source RS is collected via a collector and directed into the illumination system ILL. The illumination system shapes the radiation and, with the shaped illumination radiation ILR, illuminates an illumination field lying in the object plane OS of the projection lens PO or in proximity thereto. In this case, the form and size of the illumination field determine the form and size of the effectively used object field OF in the object plane OS. The illumination field is generally slot-shaped with a large aspect ratio between width and height.

The projection lens PO here has size mirrors M1 to M6 and images the pattern of the mask, on a reducing scale, into the image plane, in which the substrate to be exposed, e.g. a semiconductor wafer, is arranged. The image field IF, which is optically conjugate with respect to the object field, lies in the image plane. All of the mirrors are covered with multilayer reflection coatings which have a reflective effect for EUV radiation and which can contain e.g. Mo/Si layer pairs (bilayer).

The projection radiation PR passing from the mask M to the substrate is successively reflected at the six mirrors (first mirror M1 to sixth mirror M6). All rays which pass from the object field to the image field and which contribute to image generation form a three-dimensional "light quiver" LK. In the two-dimensional sectional view in FIG. 1A, only the edges R1 and R2 of the light quiver LK lying in the plane of the drawing can be seen.

A device RST for holding and manipulating the mask M (reticle) is arranged such that the pattern PAT arranged on the mask lies in the object plane OS of the projection lens PO, which is also designated here as the reticle plane. The mask is movable in this plane for scanner operation in a scanning direction (y-direction) perpendicularly to the reference axis AX of the projection lens (z-direction) with the aid of a scan drive.

The substrate W to be exposed is held by a device WST comprising a scanner drive in order to move the substrate synchronously with the mask M perpendicularly to the reference axis AX in a scanning direction (y-direction). Depending on the design of the projection lens PO, these movements of mask and substrate can be effected in a manner parallel or antiparallel with respect to one another.

The device WST, which is also referred to as a "wafer stage", and the device RST, which is also referred to as a "reticle stage", are part of a scanner device controlled via a scan control device, which, in the embodiment, is integrated into the central control device CU of the projection exposure apparatus.

All optical components of the projection exposure apparatus WSC are accommodated in an evacuatable housing. The projection exposure apparatus is operated under vacuum.

EUV projection exposure apparatuses having a similar basic construction are known e.g. from WO 2009/100856 A1. Projection lenses having a similar basic construction are known e.g. from U.S. Pat. No. 6,927,901 B2. The disclosure of the documents is in this respect incorporated by reference in the content of this description.

The projection exposure apparatus WSC has an operating control system configured for performing a near-instantaneous fine optimization of imaging-relevant properties of the projection exposure apparatus in reaction to environmental influences and other disturbances and/or on the basis of stored control data. For this purpose, the operating control system has a multiplicity of manipulators that allow a targeted intervention in the projection behavior of the apparatus. An actively drivable manipulator contains one or a plurality of actuating elements or actuators, the present actuating value of which can be changed on account of control signals of the operating control system by defined actuating value alterations being performed.

Provision can be made, for example, for altering or deforming individual optical elements or groups of optical elements with regard to their position. A corresponding manipulator can contain, for example, movably mounted optical elements which can be displaced parallel to an optical axis of the optical system or perpendicular thereto and/or can be tilted about an axis running perpendicular to the optical axis. Other manipulators can contain one or a plurality of deformable optical elements or locally heatable and/or coolable optical elements. Other manipulators can contain optical elements displaceable relative to one another, for example in the form of plates having aspherical surfaces. A manipulator can also contain exchangeable optical elements. Furthermore, thermal manipulators are known, which cause a variation of the irradiance of zones within or outside the optical used region of an optical element at the used wavelength of the lithographic imaging or a wavelength deviating therefrom, in order to produce targeted heating effects. Corresponding devices which act on the substrate or on the mask can likewise be provided.

A mask manipulator MM has actuators which, depending on driving, can bring about a displacement of the mask M parallel to the reference axis AX or perpendicular thereto and a tilting of the mask as a whole. The mask manipulator can also be designed such that, alternatively or additionally, a deformation of the mask can be performed.

A substrate manipulator MSUB has actuators which make it possible to alter the position of the substrate with respect to the projection lens by displacement parallel to a reference axis or displacement perpendicular thereto and/or by tilting and/or to deform the substrate.

The first mirror M1, which directly follows the mask or the object plane in the radiation transmission direction, can be tilted and/or displaced transversely with respect to the light propagation direction and/or deformed via a first mirror manipulator MM1.

Corresponding mirror manipulators can also be provided for one or more of the other mirrors. In particular, in the present case, a third mirror manipulator MM3 is provided at the third mirror M3, which third mirror manipulator can displace and/or tilt and/or deform the third mirror as a whole transversely or parallel to the light propagation direction.

The projection exposure apparatus furthermore has a light quiver detection system for determining at least one light quiver parameter which describes a property of the light quiver LK. The light quiver detection system includes a light quiver detection device LKD, which is assigned to the second mirror M2 lying in the ray path between the first mirror M1 and the third mirror M3. The light quiver detection device LKD is constructed such that it is thereby possible to detect quantitatively light quiver parameters with regard to the position, form and/or size of the "footprint" of the light quiver on the second mirror M2. Various embodiments of suitable light quiver detection devices are explained in greater detail further below.

The term "footprint" here denotes the spatially delimited intersection surface between the concavely curved mirror surface of the second mirror and the light quiver reflected at the second mirror. The footprint therefore corresponds to the totality of all of the ray impingement points of the rays running in the light quiver with the mirror surface, which here serves as a measurement surface for determining properties of the light quiver.

The footprint FP of the light quiver on the mirror surface of the second mirror M2 is illustrated schematically in FIG. 1B. In the case of the example, the footprint is delimited by a single circumferential edge curve. A footprint can also have a plurality of spatially separate intersection surfaces which are each inherently enclosed by an edge curve.

With reference to FIG. 1A, an explanation will now be given, by way of example, of the manner in which the control of manipulators of the projection exposure apparatus can be carried out taking account of properties of the light quiver. For this purpose, it should be assumed that the operating control system has tilted the first mirror M1 in reaction to an external disturbance from the zero position, illustrated by a solid line, into a tilted position, illustrated by a dashed line, in order to counteract the negative influence of the external disturbance on the imaging properties of the projection lens. As a result, the angles of incidence of the radiation change in the illuminated region (i.e. in the "footprint") of the first mirror, such that the rays reflected by the first mirror run in other directions, thus resulting overall in a tilting and, if appropriate, also a change in the cross section of the light quiver downstream of the first mirror. The displacement of the light quiver is illustrated by the edges R1', R2' of the tilted light quiver, the edges being depicted in dashed fashion.

This tilting of the light quiver becomes apparent on the mirror surface of the downstream second mirror M2 as a lateral displacement of the footprint from FP to FP' and, if appropriate, also in a slight change of form and/or size of the footprint, although the position change is particularly clear here.

The altered reflection conditions at the second mirror M2 on account of the tilting of the first mirror M1 can subsequently have the consequence that although that aberration which was intended to be reduced by the tilting of the first mirror is actually reduced, other lithographic aberrations are produced or intensified, in particular those which result from a displacement of the light quiver.

By using the light quiver detection system, however, it is possible at least in part to limit and, if appropriate, compensate for such aberrations. The lateral displacement of the footprint on the second mirror is detected and reported back to the operating control system. The latter thereupon calculates actuating value changes for downstream mirrors in order to avoid lithographic aberrations outside tolerance. In the case of the example, taking account of the position change of the light quiver at the second mirror M2, the third mirror manipulator MM3 assigned to the third mirror M3, or the actuators of the mirror manipulator, is driven such that its mirror surface is tilted in such a way that the course of the light quiver downstream of the third mirror does not deviate, or deviates only slightly, from that course which would have resulted without the manipulator interventions.

Figure 2A:
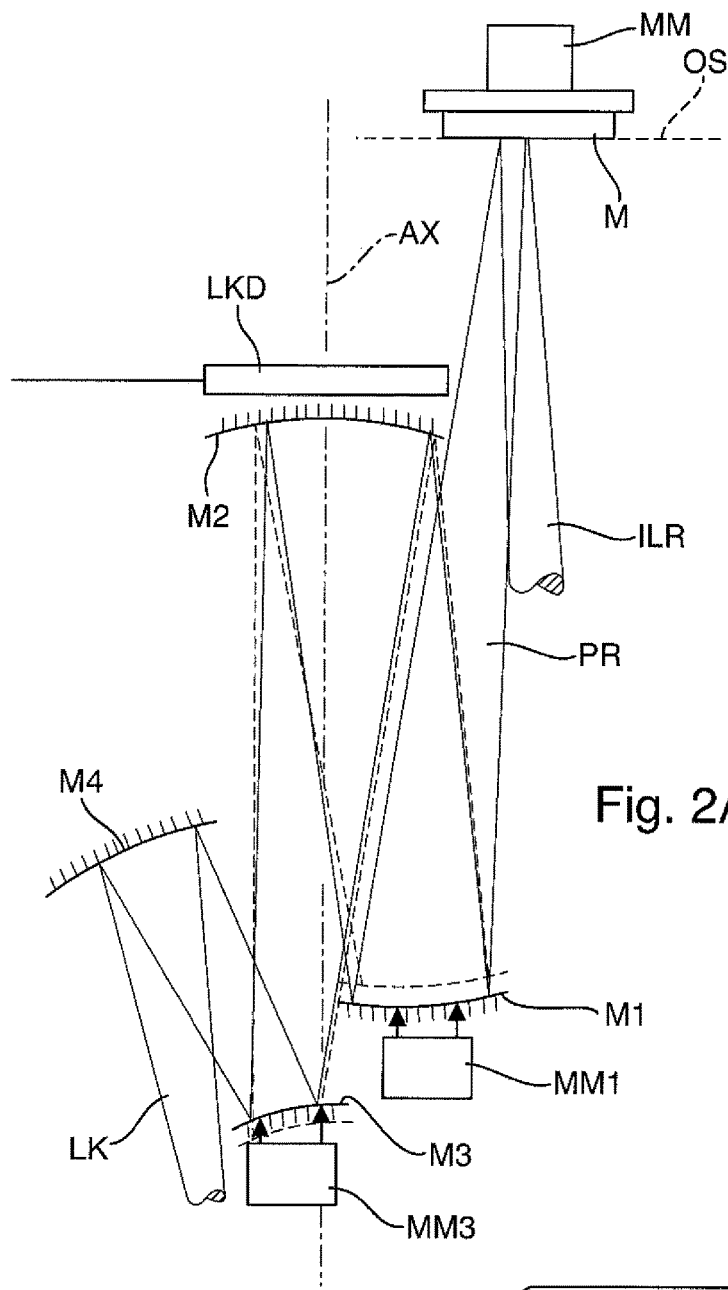
FIGS. 2A and 2B show the components of the projection exposure apparatus from FIGS. 1A and 1B in other operating states.
Figure 2B:
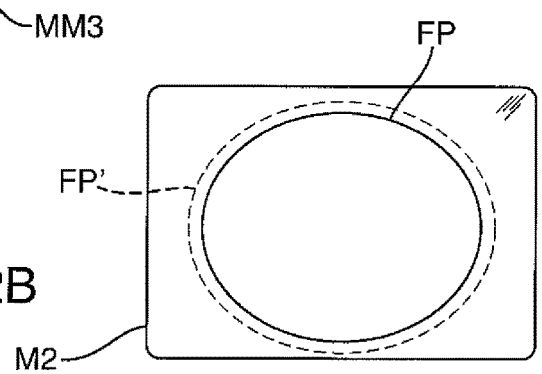

Another possibility for altering the light quiver becomes clear with reference to FIGS. 2A and 2B, which shows the projection exposure apparatus from FIGS. 1A and 1B in another operating state. In this case, the operating control system, in reaction to internal and/or external disturbances, has displaced the first mirror M1 via the first mirror manipulator MM1 forward, i.e. in the direction of the impinging radiation or closer to the second mirror into the displaced position, illustrated in dashed fashion. The associated change in the reflection conditions has the effect that the footprint FP' of the altered light quiver, illustrated in dashed fashion, is enlarged relative to the footprint FP before the displacement of the first mirror. In the case of the example, the extent of the first footprint is enlarged in all directions within the second mirror surface. This change in the size of the footprint is then quantitatively detected via the light quiver detection device LKD assigned to the second mirror M2 and a corresponding light quiver form parameter is reported back to the operating control system. In order to minimize the effects of this alteration of the light quiver on the entire imaging performance, in reaction thereto the third mirror M3, via the assigned third mirror manipulator MM3, is displaced from its zero position (solid line) predetermined by the design into a pulled back position, illustrated in dashed fashion, toward the rear, such that the course of the light quiver downstream of the third mirror substantially corresponds to that course which would have arisen without the alteration of the light quiver in the region of the first to third mirrors.

Figure 3A:
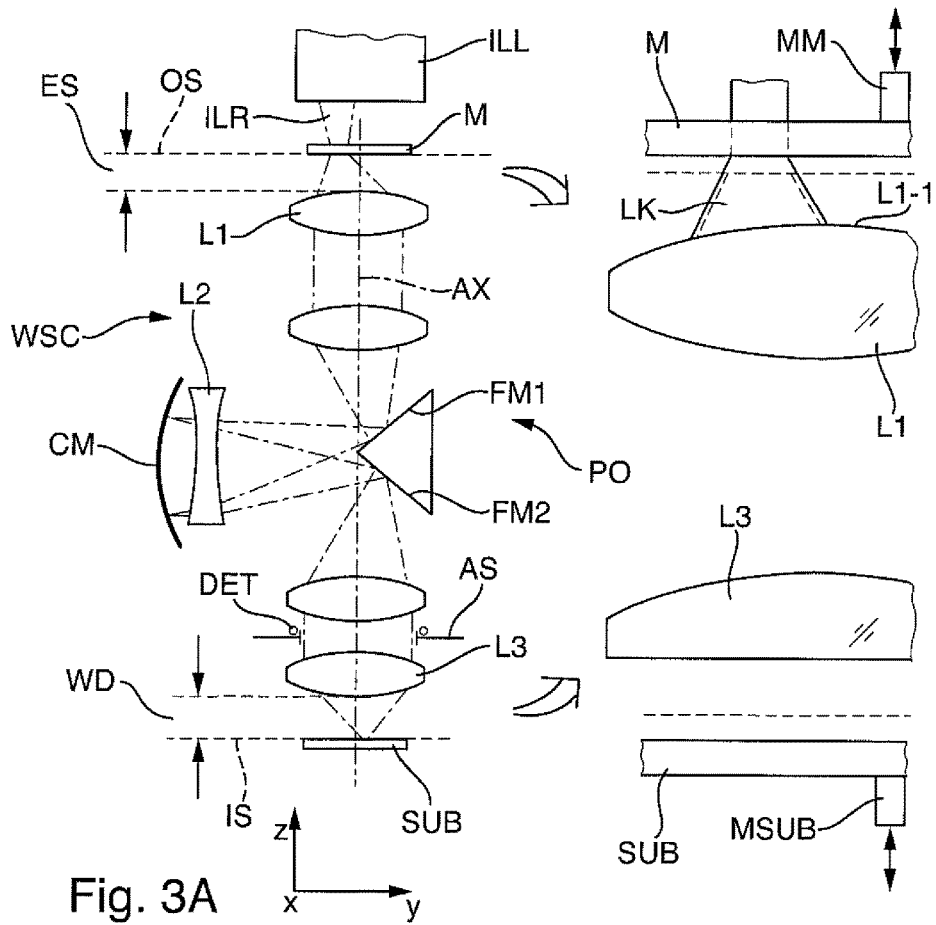
FIGS. 3A and 3B schematically show components of a DUV microlithography projection exposure apparatus comprising a catadioptric projection lens in accordance with one embodiment of the invention in different operating states.
Figure 3B:
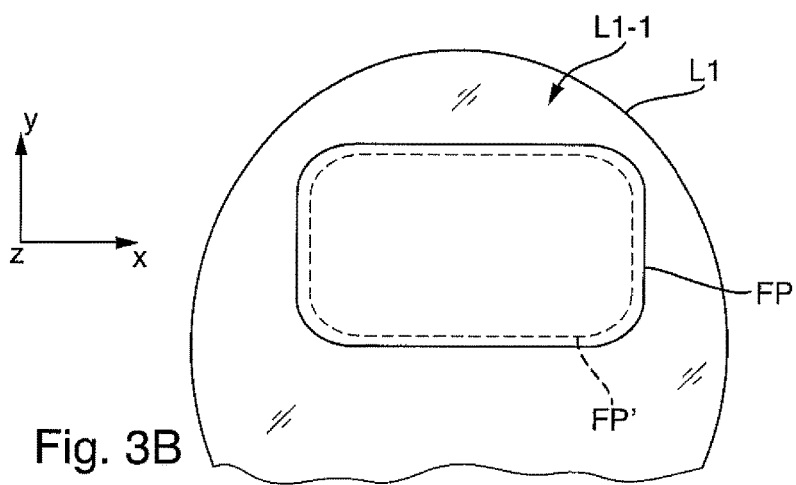

FIGS. 3A-3B a further example of a variation of the light quiver on the basis of a projection exposure apparatus WSC which operates with primary radiation from the deep ultraviolet range at 193 nm, is constructed with refractive and reflective elements and has an illumination system ILL for illuminating a mask M and a catadioptric projection lens PO. The projection lens has, in addition to a multiplicity of lens elements (e.g. lens elements L1, L2 and L3), a single concave mirror CM, which is arranged in the region of a pupil surface of the projection lens optically between object plane OS and image plane IS. The radiation emerging from the transmissive mask M is directed via a planar first folding mirror FM1 to the concave mirror. The radiation reflected by the concave mirror is deflected via a planar second folding mirror FM2 in the direction of the substrate situated in the image plane IS, which is parallel to the object plane OS. The projection lens has three interlinked lens parts, such that two real intermediate images are generated between the object plane and the image plane, of which intermediate images the first lies in the vicinity of the first folding mirror FM1 and the second lies in the vicinity of the second folding mirror FM2. Projection lenses of this type are known, in principle, for example from the international patent application having publication number WO 2011/038840, for which reason a more detailed description is omitted. The disclosure content of the document is in this respect incorporated by reference in the content of this description.

The position of the mask or of the pattern carried or formed thereby with respect to the projection lens can be altered with the aid of a mask manipulator MM e.g. by the displacement of the masks parallel to the axis AX. As a result, there is then also a change in the input vertex focal length ES, which is defined here as the axial distance between the position of the pattern of the mask and the position of the entrance surface of the first lens element L1 along the optical axis. The position of the substrate SUB can be changed with the aid of a substrate manipulator MSUB by tilting and/or displacement along the optical axis. Upon displacement along the optical axis, the working distance WD changes, which is defined here as the axial distance between the position of the light-sensitive top side of the substrate and the exit surface of the last lens element L3, measured along the optical axis.

If, as indicated by the dashed lines in the detail illustration shown on the right, the input vertex focal length ES is then reduced by axial displacement of the mask on account of control commands of the operating control system, then this has the consequence, inter alia, that the footprint FP of the light quiver LK emerging from the mask on the first lens element surface L1-1 is reduced on all sides (see FIG. 3B). Alterations of position and/or size and/or form of the light quiver also arise at other optical surfaces of the projection lens, for example at the first folding mirror FM1 and second folding mirror FM2, at other lens element surfaces and/or in the region of the aperture stop AS arranged between the second folding mirror FM2 and the image plane. This variation of the light quiver can be detected by one or a plurality of light quiver detection devices and used for controlling the operation of the projection exposure apparatus.

Figure 4:
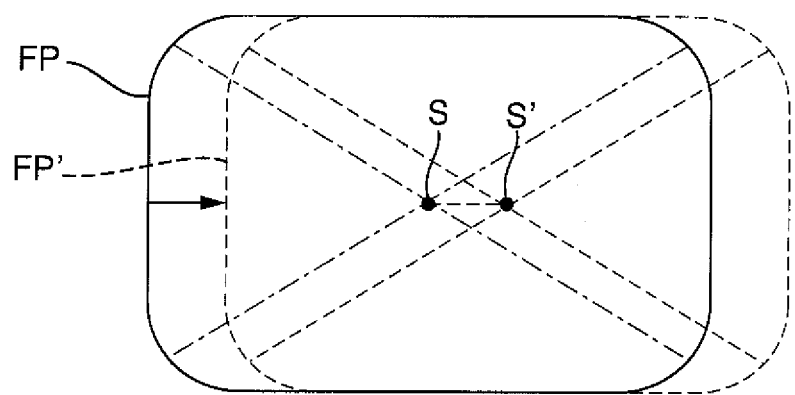
FIG. 4 schematically shows the displacement of a footprint of a light quiver on an optical element, wherein the displacement leads to a displacement of the geometric centroid.
Figure 5:
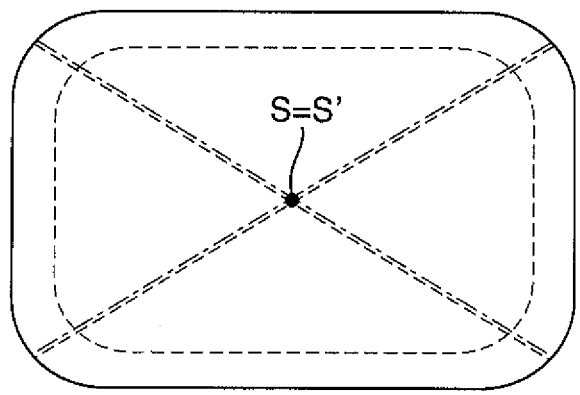
FIG. 5 schematically shows the symmetrical reduction of a footprint of a light quiver on an optical element, wherein the reduction does not lead to a displacement of the geometric centroid.
Figure 6A:
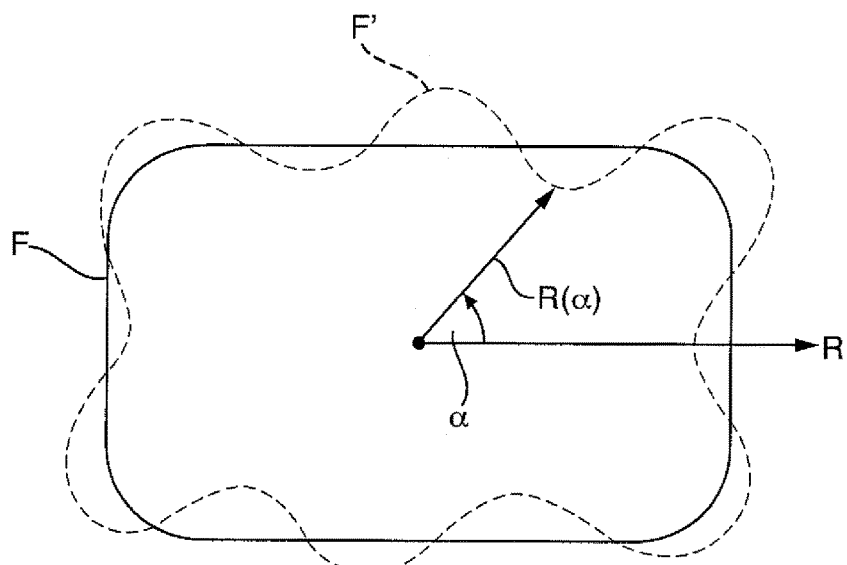
FIGS. 6A and 6B schematically show a complex form change of a footprint of a light quiver on an optical element and an edge curve function derived therefrom, respectively.

With reference to FIGS. 4 to 6, an explanation is given below of some light quiver parameters, which can be determined and used individually or in combination in embodiments to quantitatively determine the variation of the light quiver, i.e. its alteration relative to a reference state.

It is evident from FIG. 4 that a displacement of a footprint (or generally of an intersection surface of the light quiver with a measurement surface intercepting the light quiver) as a whole can be characterized on the basis of a displacement of the centroid S of the intersection surface. In this case, the footprint FP before the lateral displacement is shown by a solid line; the dashed line shows the edge curve of the displaced footprint FP' after the displacement. It is evident that the geometric centroid S has shifted into the position of the displaced centroid S'.

With reference to FIG. 5 it becomes clear that not every alteration of the light quiver necessarily also leads to a displacement of the centroid S. In the example in FIG. 5, the footprint FP has been reduced (dashed line FP') on all sides overall from the original form, but the position of the centroid S remains unchanged, such that the centroid S' of the footprint FP' lies at the same location or at the same position after the change.

It is already evident from this simple comparison that the determination of a light quiver centroid parameter, which the position of the centroid of the intensity distribution within the intersection surface (e.g. footprint) is a useful parameter for differentiating, for example, displacements of the light quiver as a whole from uniform enlargements or reductions of the cross section of the light quiver on all sides.

Figure 6B:
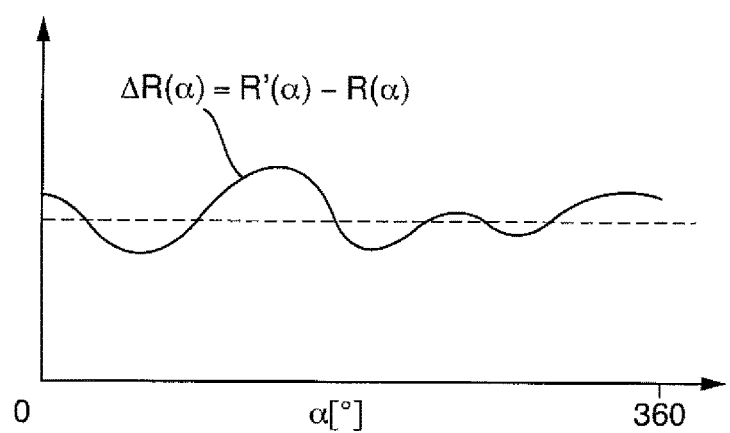

The determination of the position of the centroid is used in some embodiments to obtain a quantitative description of the form of the intersection surface, i.e. of its shape. In the example in FIGS. 6A and 6B, the centroid S of the intersection surface is chosen as the origin of a two-dimensional coordinate system. The form of the edge of the intersection surface is described by an edge curve function $R(\alpha)$, which describes the dependence of the radial distance R of the edge or of the edge curve on the centroid as a function of the azimuth angle $\alpha$. In this case, the function $R(\alpha)$ stands for the description of the form of the intersection surface before the alteration and $R'(\alpha)$ stands for the corresponding description after the variation of the light quiver. FIG. 6B shows, by way of example, a diagram of the function $\Delta R(\alpha) = R'(\alpha) - R(\alpha)$ which results from the situation in FIG. 6A. For further quantification of the form change, these functions can be decomposed into Fourier coefficients, for example, which are taken as a basis for the further processing (cf. description contained in FIGS. 7A-7G)

In order to explain this in greater detail, with reference to FIGS. 7A-7G the effect of an astigmatic mirror deformation on the light quiver and the quantitative description thereof via a Fourier decomposition of the edge curve deformation of a footprint will be explained in greater detail. For this purpose, FIG. 7A shows two mirrors $M_i$ and $M_{i+1}$ directly succeeding one another in the light propagation direction and also the course of the light quiver LK in the region of the mirrors. The plan view of the mirror $M_i$ in FIG. 7B characterizes an astigmatic deformation, wherein the diametrically opposite sectors identified by "+" are deformed forward, for example, and the sectors situated offset by 90° with respect thereto and designated by "−" are deformed in the opposite direction. The corresponding deformations are illustrated again in FIG. 7C on the basis of a section in the x-direction and in FIG. 7D on the basis of a section in the y-direction. FIG. 7E shows a corresponding effect on the form of the footprint at the mirror $M_{i+1}$ situated downstream, i.e. subsequently in the light propagation direction. In this case, the solid line FP shows the form of the footprint in the absence of the deformation, while the dashed line FP' shows the cross-sectional form—resulting from the deformation— of the light quiver on the mirror surface of the mirror $M_{i+1}$. The corresponding function profile of the edge curve function $\Delta R(\alpha)$ in FIG. 7F is analyzed via Fourier decomposition $F(\Delta R(\alpha))$. This Fourier decomposition (FIG. 7G) shows the second-order undulation of the deformation.

For the purpose of further explanation, let us imagine a manipulation at a pupil mirror arranged in the region of a pupil surface of the projection lens and look at the effect that arises in the region of a surface which occurs later in the light path and likewise lies near the pupil. Relative to the example in FIGS. 3A-3B, this can be e.g. the tilting of the concave mirror CM, the effects of which in the region of the aperture stop AS situated downstream in the light path will be considered.

Figure 8A:
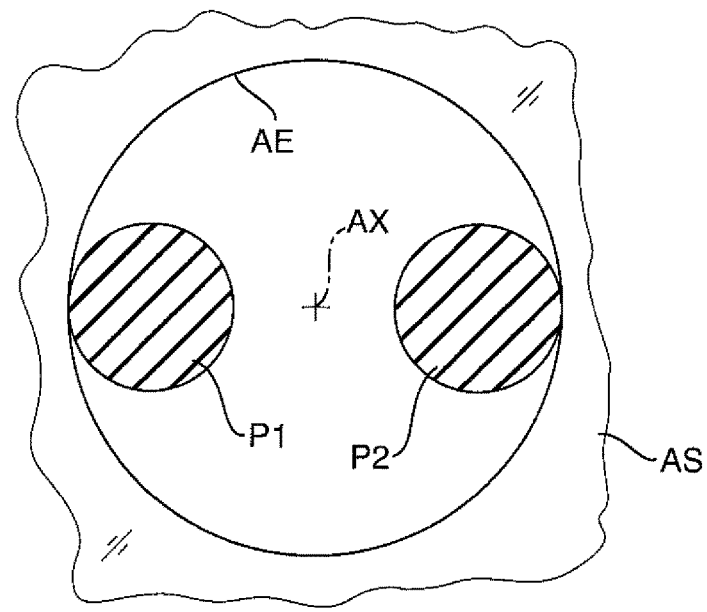
FIGS. 8A and 8B show axial plan views of an aperture stop of a projection exposure apparatus which is operated with a dipole illumination setting, and in which a displacement of the poles and partial shading of light of one of the poles occur.
Figure 8B:
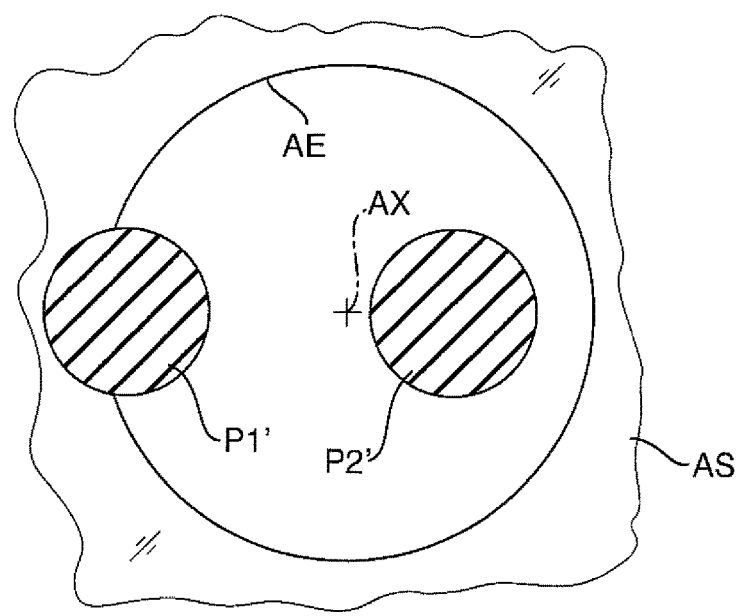

For illustration purposes, FIGS. 8A and 8B show axial plan views of the planar aperture stop AS which is arranged in the region of the third pupil surface of the projection lens and which defines a stop plane lying in the plane of the drawing. The aperture stop has a circular stop opening enclosed by a stop edge AE and situated centrally with respect to the optical axis AX. A dipole illumination setting is used for the imaging of fine line patterns running in the X-direction, in the case of which setting the intensity distribution in the pupil plane is characterized by two illumination poles P1, P2 lying approximately diametrically with respect to the optical axis in the Y-direction. The poles correspond to the intersection surfaces of the light quiver with the stop plane, that is to say that light quiver is split into two in this region.

In the case of an undisturbed system (FIG. 8A), the poles lie symmetrically exactly within the stop opening, such that the entire intensity concentrated in the poles can pass through the aperture stop without being disturbed. However, if a tilting of the light quiver in the Y-direction arises, then the poles can move e.g. toward the left, such that the first displaced pole P1' partly overlaps the stop edge, while the second pole P2' moves away from the stop edge into the interior of the stop opening. The displaced left-hand first pole P r is thereby partly cut off or masked out. The light outside the stop edge does not pass into the image field. As a result, not only do the light intensity and the imaging contrast decrease there, but an obliquely extending aerial image also arises, i.e. an obliquely extending three-dimensional intensity distribution in the image space. This so-called telecentricity error, in the event of deviations of the image plane from the ideal focus position (caused e.g. by an uneven substrate and/or undesirable position fluctuations of the substrate holder), can cause a lateral movement of the imaged structures, in a manner similar to a distortion. An asymmetrical cutting-out of diffraction light can thus lead, inter alia, to telecentricity errors and imaging differences between horizontal and vertical structures (HV differences). This lithographic aberration can be kept small or compensated for or avoided when account is taken of the light quiver variation in the control of the projection exposure apparatus As mentioned, one possible classification could be based on the fact that the movement of the centroid of the intersection surface and an azimuthal Fourier decomposition of the changes of the light quiver edge which then still result are considered (FIG. 6). For this purpose, for a suitable number of points of the edge curve, it is possible to define an azimuth angle on the basis of its connecting line with respect to the centroid S. In this case, the centroid can be defined via an averaging of a sufficiently large number of rays, e.g. the rays being given by an equidistant rasterization of field and pupil. In this case, an undisturbed reference system is always taken into consideration, with respect to which each ray $S_i$ generates an intersection point $D_{ij}$ on a measurement surface $F_j$. The positions of these points in space can be described by Cartesian coordinates $(x_{ij}, y_{ij}, z_{ij})$. For the disturbed system, that is to say for the displacement and/or form change of the light quiver, initially the same rays are taken into consideration, and the corresponding intersection points are designated by $D'_{ij}$ $(x'_{ij}, y'_{ij}, z'_{ij})$. Displacement vectors $(v_{ij} = D'_{ij} - D_{ij} = x'_{ij} - x_{ij}, y'_{ij} - y_{ij}, z'_{ij} - z_{ij})$ can be determined therefrom. The displacement vectors can be averaged and yield a centroid displacement.

In accordance with one classification, the change in a light quiver on a given measurement surface can be described by a centroid displacement in three-dimensional space and by the Fourier coefficients of the projection of the azimuthal differences after correction of the centroid displacement on a circle.

In the case of this classification of light quiver variations, a pure radial change (enlargement or reduction that is uniform on all sides) would be represented as a zeroth-order change. A second-order change would be an enlargement on both sides of an axis running through the centroid with simultaneous reduction on an axis running perpendicularly thereto through the centroid. A third-order alteration would be an ovoid deformation, etc.

One advantage of this quantification of variations of the light quiver is that the above-defined centroid displacement and the Fourier decomposition of the edge curve deformation can be calculated beforehand for each system variation via ray tracing and can be stored in a memory of the operating control system. The corresponding light quiver parameters which allow a quantification of the alteration of the light quiver can correspondingly also be calculated beforehand for defined actuating value changes at manipulators. It is thus possible to quantitatively detect the relationship between a defined actuating value change at a manipulator and the resultant alteration of the light quiver or the resultant effect on the imaging quality of the projection exposure apparatus. The relationship can be stored in the form of sensitivities or sensitivity values in the memory. During operation, actuating value changes of manipulators with regard to the light quiver variations caused thereby, by the use of the sensitivities, can then be limited to relatively non-critical extents below an actuating value limit value, such that excessively great actuating value changes are avoided if they would bring about a critical alteration of the light quiver.

These simple examples show how, in some embodiments, the variation of the light quiver can be quantitatively described and, if appropriate, classified in order to avoid countermeasures against undesired effects on the imaging performance in a targeted manner via the operating control system.

There are numerous possibilities for realizing light quiver detection devices for a quantitative detection of light quiver variations in a light quiver detection system. Especially in the case of mirrors it is possible to detect the residual light transmitted in the region of the footprint, that is to say e.g. the local intensity distribution at the rear side of a mirror. It is also possible, via heating of optical elements which become apparent in the image via deformation and/or refractive index change, to draw conclusions about the local distribution of the radiation energy input. It is also possible to observe an optical element during operation via a separate observation optical unit with regard to its form and to deduce the position of the radiation centroid in a footprint from temperature-induced, time-dependent deformations of the observed surface form. Likewise, wires or other elements exhibiting electrical resistance that varies in a temperature-dependent manner can be integrated into an optical element and the electrical resistance can be determined in a spatially resolved manner, as a result of which it is possible to derive a temperature map or a spatially resolving temperature profile and therefrom a spatially resolving profile of a radiation loading.

With reference to FIGS. 9A and 9B, a description is given of an exemplary embodiment of a light quiver detection device LKD having a multiplicity of optical detectors DET which are sensitive to radiation having the operating wavelength of the projection exposure apparatus. The detectors DET of the light quiver detection device is situated at a concave mirror CM, the concavely curved front side of which has an optical used region OUA lying in the projection beam path and a ring-shaped edge region ER lying outside the optical used region and surrounding the optical used region. In the optical used region, the mirror surface is prepared with optical quality, while the edge region lying outside only has to satisfy less stringent quality requirements made of fit and the like. The form and the size of the optical used region are designed on the basis of the lens design such that the footprint FP of a light quiver of the undisturbed system lies fully within the optical used region and a tolerance region TOL still remains at the edge of the footprint, into which tolerance region radiation is still permitted to pass in the case of a non-ideal system. In a manner directly adjoining the tolerance region, in the edge region of the mirror the detectors DET are arranged equidistantly in a ring-shaped arrangement. During the operation of the projection exposure apparatus, that is to say when radiation passes through the projection exposure apparatus, the light-sensitive detectors are situated in a manner distributed uniformly and in the circumference of the light quiver.

The arrangement is designed such that, in the case of an undisturbed light quiver, all detectors acquire a specific intensity level of superaperture light, which intensity level can be calculated beforehand, if appropriate. In some cases, e.g. a mirror-symmetrical distribution can arise, but the distribution can also be asymmetrical. In the case of a lateral displacement and/or deformation of the form of the footprint, a temporal change in the intensity distribution arises in the ring-shaped arrangement, and this is detected by the detectors and evaluated by the light quiver detection system in order to derive light quiver parameters therefrom. It is thus possible to perform a qualitative or quantitative comparison between an initial state (before an alternation of radiation transmission conditions) and an end state (after the alteration). Alternatively or additionally, it is also possible to take the initial state as a reference for the comparison and, on the basis thereof, to assess the temporal alteration of the intensity distribution.

In a corresponding manner, arrangements of light-sensitive detectors can also be arranged on an extraneous light diaphragm and/or on the aperture stop. In this respect, FIG. 3A shows detectors DET of a light quiver detection device at the light entrance side of the aperture stop AS for detecting variations of the light quiver in the region of the pupil surface closest to the image.

In general it is advantageous if the entire aperture region (near a pupil plane) or subaperture region (at a distance from the pupil plane) detected by a light quiver detection device is scanned equidistantly or almost equidistantly.

FIG. 10 shows an example in which a light quiver detection device has detectors arranged at the sides of a wedge-shaped extraneous light diaphragm SB. The left detector DET1 is designed to detect positional alterations of a section of the light quiver which contains the rays incident on a mirror $M_i$, while the right detector DET2 is designed to detect positional alterations of a section of the light quiver which contains the rays reflected by the mirror $M_i$. In this case, therefore, detectors of the light tube detection device are mounted on an element separate from the mirror. That can be advantageous e.g. because mirrors without detectors can be smaller, lighter and dynamically better controllable than those having detectors. The structural space not used for detectors on the mirror can be used for other devices, e.g. position sensors, cooling devices and/or manipulators.

The choice of preferred locations for mounting light detection devices can be made according to various criteria. It is often expedient, during the design of the projection exposure apparatus, beforehand to simulate all effects of manipulators and to mount a sensor system where a particularly strong signal is calculated especially for a high centroid displacement. Furthermore, preferred locations for mounting detectors for light detection devices can be where a great deviation of the light quiver from its undisturbed reference state would have particular consequences, for example because mechanical components are arranged there in direct proximity to the light quiver. Corresponding sensors can also be mounted in positions optically conjugate with respect thereto. In general, it will be expedient, as in the case of the example in FIGS. 9A and 9B, to mount the detectors as closely as possible to the light quiver, but alongside the light quiver, the form and/or position of which result from the original design plus tolerances.

The invention claimed is:

1. A method of operating an apparatus comprising an illumination system and a projection lens, the method comprising:
   using the illumination system to illuminate an illumination region of a mask located in a region of an object plane of the projection lens; and
   using the projection lens to project a part of a pattern of the mask located in the illumination region onto an image field of the projection lens to generate an image of the part of the pattern of the mask in the image field, all rays of radiation which contribute to generating the image of the part of the pattern of the mask in the image field forming a light quiver in the projection lens,
   wherein the method comprises controlling operation of the apparatus by taking into account a parameter which describes a property of the light quiver.

2. The method of claim 1, further comprising determining the parameter.

3. The method of claim 1, further comprising driving a manipulator to alter a property of the light quiver.

4. The method of claim 1, further comprising controlling operation of the apparatus by taking into account a sensitivity of a manipulator for altering the light quiver, wherein the sensitivity describes a relationship between an actuating value change at the manipulator and the resultant effect on an imaging quality of the apparatus.

5. The method of claim 1, further comprising determining the parameter by a method which comprises determining a property of a surface, wherein the property is dependent on an intensity of the radiation in the surface, and the surface is defined by a region that: a) intersects the light quiver; and b) is transverse to the light quiver.

6. The method of claim 5, further comprising a determining a property of the surface, and determining the parameter from the property.

7. The method of claim 5, wherein at least one of the following holds:
   the method further comprises determining a form of the surface, and determining the parameter from the determined form of the surface;
   the method further comprises determining a position of the surface with respect to a reference coordinate system, and determining the parameter from the determined position;
   determining a size of the surface, and determining the parameter from the determined size of the surface; and
   determining a centroid of an intensity distribution within the surface, and determining the parameter from the determined centroid.

8. The method of claim 5, further comprising:
   determining at least two properties of the surface in temporal proximity or at the same time; and
   taking into account corresponding parameters of the light quiver computationally with one another.

9. The method of claim 5, further comprising:
   determining properties of the light quiver by determining a position of a centroid of an surface;
   on the basis of the determined centroid, determining an edge curve function which describes a distance between an edge curve of the surface and the centroid as a function of an azimuth angle; and
   analyzing the edge curve function.

10. The method of claim 9, wherein analyzing the edge curve function comprises performing a Fourier analysis of the edge curve function.

11. The method of claim 5, further comprising measuring a property of the surface to determine the parameter, wherein the surface is an optical surface of an optical element, and the property of the surface is variable due to radiation incident on the optical element.

12. The method of claim 11, wherein the property of the surface is a local temperature distribution of the surface.

13. The method of claim 5, wherein the surface is downstream of a first manipulator in a radiation transmission direction, and the method further comprises controlling manipulated variable changes of an actuator of the first manipulator dependent on at least one parameter of the light quiver determined at the surface.

14. A method, comprising:
    holding a mask between an illumination system and a projection lens of a projection exposure apparatus so that a pattern is arranged in the region of the object plane of the projection lens;
    holding a substrate so that a radiation-sensitive surface of the substrate is arranged in a region of an image plane of the projection lens, the image plane being optically conjugate with respect to the object plane;
    illuminating an illumination region of the mask with an illumination radiation provided by the illumination system;
    projecting a part of the pattern lying in the illumination region onto an image field at the substrate with the aid of the projection lens, wherein all rays of the projection radiation which contribute to image generation in the image field form a light quiver in the projection lens,
    wherein the method comprises determining at least one light quiver parameter which describes a property of the light quiver, and controlling operation of the projection exposure apparatus takes account of the light quiver parameter.

15. A projection exposure apparatus configured to expose a radiation sensitive substrate with at least one image of a pattern of a mask, the apparatus comprising:
    an illumination system configured to receive primary radiation of a primary radiation source and to generate an illumination radiation directed onto the mask in an illumination region;
    a substrate holding device configured to hold the substrate so that a radiation sensitive surface of the substrate is arranged in the region of an image plane which is optically conjugate with respect to the object plane;

a light quiver detection system configured to determine a parameter which describes a property of the light quiver; and an operating control system configured to control the operation of the projection exposure apparatus taking account of the light quiver parameter.

16. The apparatus of claim 15, further comprising:

a projection lens configured to project a part of the pattern lying in the illumination region onto an image field at the substrate with projection radiation such that all rays of the projection radiation which contribute to image generation in the image field define a light quiver in the projection lens; and a mask holding device configured to hold the mask between the illumination system and the projection lens so that the pattern is arranged in the region of an object plane of the projection lens.

17. The apparatus of claim 15, further comprising a manipulator configured to be driven via control signals of the operating control system.

18. The apparatus of claim 17, wherein:

a memory of the control system stores sensitivities of manipulators for altering the light quiver;

a sensitivity of a manipulator describes a relationship between an actuating value change at the manipulator and a resultant effect on imaging quality of the projection exposure apparatus; and the operating control system is configured so that the operation of the projection exposure apparatus is controllable taking account of the sensitivities.

19. The apparatus of claim 18, wherein the apparatus is configured so that actuating value changes of the manipulator are limited taking account of the sensitivities to magnitudes below an actuating value limit value.

20. The apparatus of claim 17, wherein:

the light quiver intersects a measurement surface running transversely with respect to the light quiver in a region of an intersection surface defined in terms of form, position and size; and a device configured to determine the parameter is configured to determine at least one intersection surface property which is dependent on an intensity of the projection radiation in the intersection surface.

21. The apparatus of claim 18, wherein an intersection surface property is from the group consisting of a form of the intersection surface, a position of the intersection surface with respect to a reference coordinate system, a size of the intersection surface, and a centroid of an intensity distribution within the intersection surface.

22. The apparatus of claim 17, wherein the light quiver detection system comprises a light quiver detection device which comprises an arrangement surrounding the light quiver, and the arrangement comprises a plurality of light sensitive detectors distributed around the circumference of the light quiver.

23. The apparatus of claim 17, wherein the light quiver detection device comprises light sensitive detectors arranged to detect extraneous light propagating outside the light quiver.

24. The method of claim 1, further comprising:

determining the parameter by a method which comprises determining a property of a surface; and driving a manipulator to alter a property of the light quiver based on the determination of the property of the surface, wherein:

the property of the surface is dependent on an intensity of the radiation in the surface;

the surface is defined by a region that: a) intersects the light quiver; and b) is transverse to the light quiver; and at least one of the following holds:

the property of the surface comprises a form of the surface;

the property of the surface comprises a position of the surface;

the property of the surface comprises a size of the surface; and the property of the surface comprises a centroid of an intensity distribution within the surface.

25. The method of claim 14, wherein:

determining the light quiver parameter comprises determining a property of a surface;

the property of the surface is dependent on an intensity of the radiation in the surface;

the surface is defined by a region that: a) intersects the light quiver; and b) is transverse to the light quiver; and at least one of the following holds:

the property of the surface comprises a form of the surface;

the property of the surface comprises a position of the surface;

the property of the surface comprises a size of the surface; and the property of the surface comprises a centroid of an intensity distribution within the surface.

26. The apparatus of claim 15, wherein:

the light quiver detection system is configured to determine the parameter by determining a property of a surface;

the property of the surface is dependent on an intensity of the radiation in the surface;

the surface is defined by a region that: a) intersects the light quiver; and b) is transverse to the light quiver; and at least one of the following holds:

the property of the surface comprises a form of the surface;

the property of the surface comprises a position of the surface;

the property of the surface comprises a size of the surface; and the property of the surface comprises a centroid of an intensity distribution within the surface.

* * * * *

UNITED STATES PATENT AND TRADEMARK OFFICE
CERTIFICATE OF CORRECTION

PATENT NO.         : 9,665,006 B2                          Page 1 of 1
APPLICATION NO.    : 14/456819
DATED              : May 30, 2017
INVENTOR(S)        : Volker Graeschus and Toralf Gruner It is certified that error appears in the above-identified patent and that said Letters Patent is hereby corrected as shown below:

In the Specification

Column 1, Line 54, delete "(recticles)." and insert -- (reticles). --.

Column 15, Line 30, delete "R′ (α)" and insert -- R′(α) --.

Column 15, Lines 32-33, delete "ΔR (α)" and insert -- ΔR(α) --.

Column 15, Line 37, after "7A-7G)", insert -- . --.

Column 16, Line 47, after "apparatus", insert -- . --.

In the Claims

Column 21, Line 44, Claim 21, delete "claim 18," and insert -- claim 20, --.

Signed and Sealed this
Tenth Day of October, 2017

Joseph Matal
*Performing the Functions and Duties of the*
*Under Secretary of Commerce for Intellectual Property and*
*Director of the United States Patent and Trademark Office*